(12) United States Patent
Gondaira et al.

(10) Patent No.: US 11,486,693 B2
(45) Date of Patent: Nov. 1, 2022

(54) MEASUREMENT APPARATUS AND MEASUREMENT METHOD

(71) Applicant: Lasertec Corporation, Yokohama (JP)

(72) Inventors: Ko Gondaira, Yokohama (JP); Teruaki Yamazaki, Yokohama (JP); Hideo Takizawa, Yokohama (JP)

(73) Assignee: Lasertec Corporation, Yokohama (JP)

( * ) Notice: Subject to any disclaimer, the term of this patent is extended or adjusted under 35 U.S.C. 154(b) by 616 days.

(21) Appl. No.: 16/528,509

(22) Filed: Jul. 31, 2019

(65) Prior Publication Data

US 2020/0041251 A1    Feb. 6, 2020

(30) Foreign Application Priority Data

Aug. 2, 2018    (JP) .............................. JP2018-146053

(51) Int. Cl.
*G01B 11/02* (2006.01)
*G01B 11/24* (2006.01)
*G01B 11/06* (2006.01)
*G01N 21/84* (2006.01)
*H01L 21/64* (2006.01)
*G01B 11/30* (2006.01)

(52) U.S. Cl.
CPC ............. *G01B 11/028* (2013.01); *G01B 11/06* (2013.01); *G01B 11/24* (2013.01); *G01B 11/30* (2013.01); *G01N 21/84* (2013.01); *H01L 21/64* (2013.01)

(58) Field of Classification Search
CPC ....... G01B 11/028; G01B 11/06; G01B 11/24; G01B 11/30; G01N 21/84; H01L 21/64
See application file for complete search history.

(56) References Cited

U.S. PATENT DOCUMENTS

2007/0045566 A1*    3/2007    McGinley ............. G03F 9/7011
250/491.1

FOREIGN PATENT DOCUMENTS

JP        2007163265 A    6/2007
JP        2007206441 A    8/2007

* cited by examiner

*Primary Examiner* — Georgia Y Epps
*Assistant Examiner* — Don J Williams
(74) *Attorney, Agent, or Firm* — McCoy Russell LLP

(57) ABSTRACT

A measurement apparatus and a measurement method capable of speedily and accurately measuring an edge shape are provided. A measurement apparatus according to an aspect of the present disclosure includes an objective lens positioned so that its focal plane cuts across an edge part of a substrate, a detector including a plurality of pixels and configured to detect a reflected light from the edge part of the substrate through a confocal optical system, an optical head in which the objective lens and the detector are disposed, a moving mechanism configured to change a relative position of the optical head with respect to the substrate so that an inclination of the focal plane with respect to the substrate is changed, and a processing unit configured to measure a shape of the edge part.

12 Claims, 18 Drawing Sheets

MEASUREMENT APPARATUS AND MEASUREMENT METHOD

CROSS REFERENCE TO RELATED APPLICATIONS

The present application claims priority to Japanese Application No. 2018-146053, entitled "MEASUREMENT APPARATUS AND MEASUREMENT METHOD", and filed on Aug. 2, 2018. The entire contents of the above-listed application are hereby incorporated by reference in their entirety for all purposes.

BACKGROUND

The present disclosure relates to a measurement apparatus and a measurement method for measuring an edge shape.

Japanese Unexamined Patent Application Publication No. 2007-206441 discloses a confocal image pickup apparatus for observing a peripheral edge of a semiconductor wafer over the entire circumference thereof. The confocal image pickup apparatus disclosed in Japanese Unexamined Patent Application Publication No. 2007-206441 includes an image pickup optical system and a rotatable table that supports a semiconductor wafer. The image pickup optical system includes an apparatus that generates a linear light beam and a linear sensor.

Japanese Unexamined Patent Application Publication No. 2007-163265 discloses a measurement apparatus for measuring a cross-sectional shape of a peripheral edge of a semiconductor wafer. The measurement apparatus disclosed in Japanese Unexamined Patent Application Publication No. 2007-163265 includes two confocal image pickup devices. Each of the image pickup devices includes means for generating a linear light beam, an objective lens that concentrates the light beam, and a linear image sensor. One of the image pickup devices takes an image of one of the inclined surfaces of the peripheral edge while the other image pickup device picks up an image of the other inclined surface. The measurement apparatus measures the cross-sectional shape based on a Z-position of the objective lens at which a brightness value is maximized by scanning (i.e., continuously or successively moving) the objective lens in an optical-axis direction (i.e., a Z-direction).

SUMMARY

In order to improve a yield rate of chips near an edge of a semiconductor wafer, quality control near the edge is important. A profile of an edge of a semiconductor wafer depends on the orientation of crystallization and changes according to the angle thereof. Therefore, an edge shape may change according to the orientation of crystallization and may change asymmetrically in the vertical direction. Therefore, it is desired to accurately measure an edge shape.

The present disclosure has been made in view of the above-described circumstances and provides a measurement apparatus and a measurement method capable of speedily and accurately measuring an edge shape.

A first exemplary aspect is a measurement apparatus including: an objective lens positioned so that its focal plane cuts across an edge part of a substrate, and configured to concentrate illumination light so that a linear illumination area is formed on the focal plane; a detector including a plurality of pixels arranged along a direction of the linear illumination area, and configured to detect a reflected light from the edge part of the substrate through a confocal optical system; an optical head in which the objective lens and the detector are disposed; a moving mechanism configured to change a relative position of the optical head with respect to the substrate so that an inclination of the focal plane with respect to the substrate is changed; and a processing unit configured to measure a shape of the edge part based on a position of the detector at which intensity of the reflected light reaches a peak.

The above-described measurement apparatus may further include a rotatable stage configured to rotate the substrate, in which the reflected light may detected while rotating the rotatable stage.

In the above-described measurement apparatus, the moving mechanism may rotationally move the optical head around a rotational axis; and the rotational axis may be perpendicular to a plane including a Z-axis parallel to a thickness direction of the substrate and an optical axis of the objective lens, and pass through the inside of the substrate.

In the above-described measurement apparatus, the processing unit may convert the position at which the intensity of the reflected light reaches the peak in the detector into an edge position on a plane including a Z-axis along a thickness direction of the substrate and an optical axis of the objective lens.

In the above-described measurement apparatus, the processing unit may obtain two edge positions disposed on both sides of the optical axis of the objective lens.

In the above-described measurement apparatus, a graph showing angle dependence of a feature value representing an edge shape may be displayed.

Another exemplary aspect is a measurement method using a measurement apparatus, the measurement apparatus comprising: an objective lens positioned so that its focal plane cuts across an edge part of a substrate, and configured to concentrate illumination light so that a linear illumination area is formed on the focal plane; a detector comprising a plurality of pixels arranged along a direction of the linear illumination area, and configured to detect a reflected light from the edge part of the substrate through a confocal optical system; and an optical head in which the objective lens and the detector are disposed, the measurement method comprising: changing a relative position of the optical head with respect to the substrate so that an inclination of the focal plane with respect to the substrate is changed; and measuring a shape of the edge part based on a position of the detector at which intensity of the reflected light reaches a peak.

In the above-described measurement method, the reflected light may be detected while rotating the substrate.

In the above-described measurement method, in the changing the relative position of the optical head, the optical head may be rotationally moved around a rotational axis; and the rotational axis may be perpendicular to a plane including a Z-axis parallel to a thickness direction of the substrate and an optical axis of the objective lens, and pass through the inside of the substrate.

In the above-described measurement method, in the measuring the shape of the edge part, the position at which the intensity of the reflected light reaches the peak in the detector may be converted into an edge position on a plane including a Z-axis along a thickness direction of the substrate and an optical axis of the objective lens.

In the above-described measurement method, in the measuring the shape of the edge part, two edge positions disposed on both sides of an optical axis of the objective lens may be obtained.

In the above-described measurement method, a graph showing angle dependence of a feature value representing an edge shape may be displayed.

According to the present disclosure, it is possible to provide a measurement apparatus and a measurement method capable of speedily and accurately measuring an edge shape.

The above and other objects, features and advantages of the present disclosure will become more fully understood from the detailed description given hereinbelow and the accompanying drawings which are given by way of illustration only, and thus are not to be considered as limiting the present disclosure.

DETAILED DESCRIPTION

Examples of embodiments according to the present disclosure will be described hereinafter with reference to the drawings. The following explanation is given for showing preferable embodiments according to the present disclosure and the technical scope of the present disclosure is not limited to the below-shown embodiments. The same symbols are assigned to the same or corresponding components throughout the drawings and duplicated explanations are omitted as appropriate for clarifying the explanation.

First Embodiment

Figure 1:
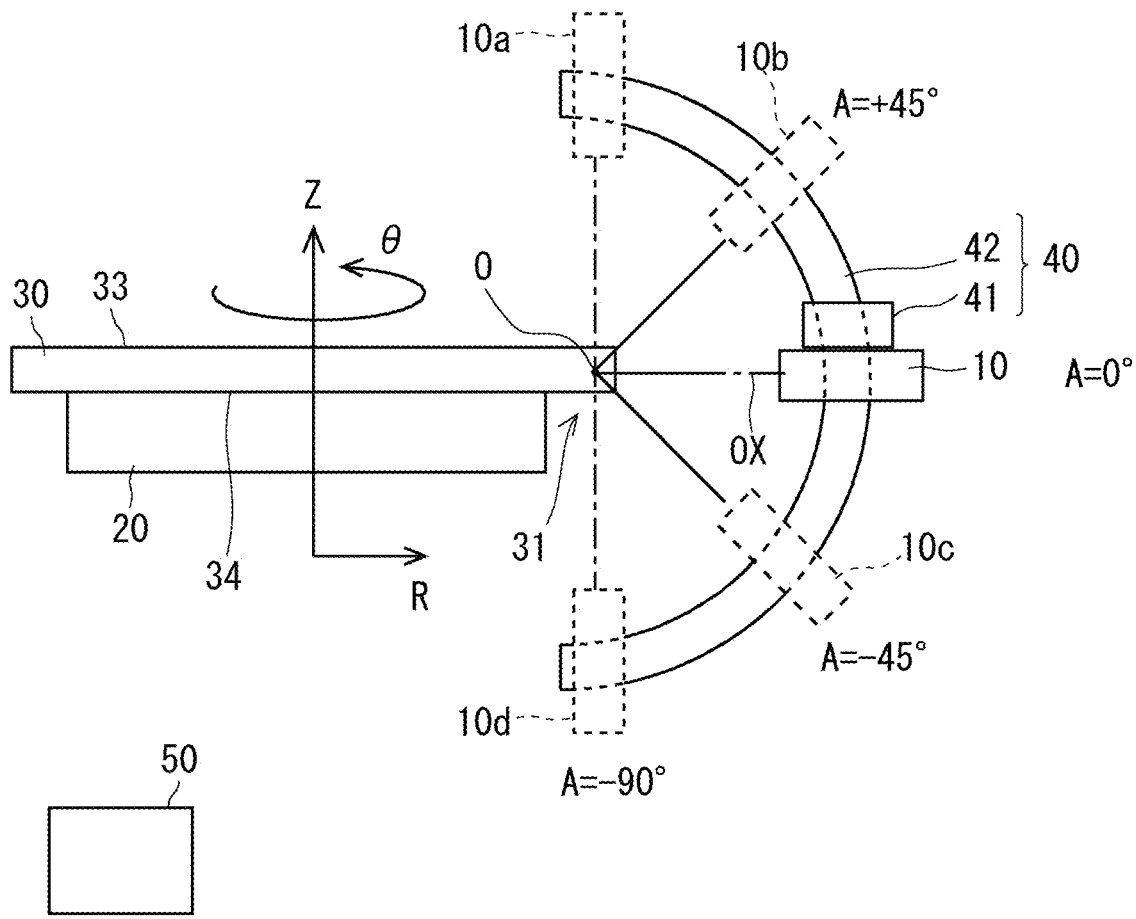
FIG. 1 is a schematic diagram showing an overall configuration of a measurement apparatus according to an embodiment.

An embodiment according to the present disclosure is explained hereinafter with reference to the drawing. A configuration of a measurement apparatus according to this embodiment is explained with reference to FIG. 1. FIG. 1 schematically shows an overall configuration of a measurement apparatus. A measurement apparatus 100 measures a shape of an edge part 31 of a substrate 30. The measurement apparatus 100 includes an optical head 10, a stage 20, a moving mechanism 40, and a processing unit 50. Note that in the following explanation, a vertically upward direction is referred to as a Z-axis positive direction. Further, it is assumed that the Z-direction is parallel to a thickness direction of the substrate 30. Further, a radial direction of the circular substrate 30 is referred to as an R-direction.

The substrate 30, which is an object to be measured, is placed on the stage 20. The substrate 30 is, for example, a circular substrate such as a semiconductor wafer. Note that the substrate 30 may have a notch(es) and an orientation flat(s). The stage 20 may hold the substrate 30 by means of a vacuum chuck or the like. The edge part 31 of the substrate 30 projects from the stage 20. That is, the stage 20 has a disk-like shape having a diameter smaller than that of the substrate 30. Note that a surface on the Z-axis positive side of the substrate 30 is referred to as a front surface 33 and a surface on the Z-axis negative side of the substrate 30 is referred to as a rear surface 34. The front and rear surfaces 33 and 34 of the substrate 30 are surfaces perpendicular to the Z-direction. The front surface 33 of the substrate 30 is a pattern-formed surface on which a pattern is formed.

The stage 20 is a rotatable stage and is configured to rotate the substrate 30 around the Z-axis. That is, the substrate 30 is rotated in a θ-direction. The Z-axis, which coincides with the rotational axis of the stage 20, passes through the center of the substrate 30 and is parallel to the vertical direction. The rotational angle of the stage 20 around the Z-axis is referred to as a θ-angle. The stage 20 can rotate the substrate 30, for example, at a constant rotational speed.

An optical system for measuring an edge shape is provided in the optical head 10. Specifically, the optical head 10 includes a line confocal optical system. The line confocal optical system includes a light source, a lens, a mirror, a sensor, and so on. The optical system provided in the optical head 10 will be described later. The optical axis of the optical head 10 is referred to as an optical axis OX.

The optical head 10 is attached to the moving mechanism 40. That is, the moving mechanism 40 supports the optical head 10 so that the optical head 10 can be moved. The moving mechanism 40 moves the optical head 10 along a circular arc (indicated as optical heads 10a to 10d in FIG. 1). Note that the center of the circular arc is referred to as a center O. The moving mechanism 40 includes a driving mechanism 41 and a guide 42. The guide 42 has a semi-circular arc shape. The center O of the circular arc of the guide 42 is positioned at the edge part 31 of the substrate 30. Therefore, one of the ends of the guide 42 is disposed above the substrate 30 (on the Z-axis positive side) and the other end is disposed below the substrate 30 (on the Z-axis negative side).

The driving mechanism 41 includes an actuator like a servo motor for driving the optical head 10. The optical head 10 is driven by the driving mechanism 41 and thereby is moved along the guide 42. That is, the optical head 10 rotationally moves. In this way, the inclination of the optical axis OX of the optical head 10 is changed. The rotational axis of the rotational movement of the optical head 10 is referred to as an A-axis. The A-axis passes through the center O located inside the substrate 30 and is parallel to the direction perpendicular to the drawing surface (i.e., the surface of the paper). That is, the A-axis is perpendicular to the plane that includes the Z-axis and the optical axis OX, and passes through the inside of the substrate 30.

An angle around the A-axis (hereinafter referred to as an A-axis angle) is defined as shown in FIG. 1. It is assumed that the A-axis angle is +90° when the optical head 10 is directly above the center O (i.e., located at the position indicated by the optical head 10a). It is also assumed that the A-axis angle is −90° when the optical head 10 is directly below the center O (i.e., located at the position indicated by the optical head 10d). When the A-axis angle is +90° or −90°, the optical axis OX of the optical head 10 is parallel to the Z-axis direction. When the A-axis angle is 0°, the optical head 10 is located directly beside the substrate 30 and the optical axis OX of the optical head 10 is perpendicular to the Z-axis. When the A-axis angle is 0°, the optical axis OX is parallel to the horizontal direction and passes through the center of the substrate 30.

For example, it is possible to measure a cross-sectional profile of the edge part 31 of the substrate 30 by scanning (i.e., continuously or successively moving) the optical head 10 around the A-axis without rotating the stage 20. Specifically, it is possible to measure an edge profile of the substrate 30 on a plane that intersects the center O and is parallel to the drawing surface. The plane on which the edge profile is measured is referred to as an RZ-plane. The rotational movement of the optical head 10 around the A-axis is a movement on the RZ-plane.

The processing unit 50 is, for example, a computer that includes a processor, a memory, and so on, and performs a process for measuring the edge shape. Further, the processing unit 50 includes a monitor for displaying a measurement result and an input device such as a keyboard, a mouse, a touch panel, and the like.

The processing unit 50 controls the driving mechanism 41 and the stage 20. The processing unit 50 collects data on the A-axis angle of the driving mechanism 41 and the θ-angle. The processing unit 50 collects detection data obtained by the optical head 10. Then, the processing unit 50 associates the detection data with the angle data and stores them in the memory or the like. The processing unit 50 performs a process for measuring an edge shape of the substrate 30 based on the detection data and the angle data. The process performed by the processing unit 50 will be described later.

Figure 2:
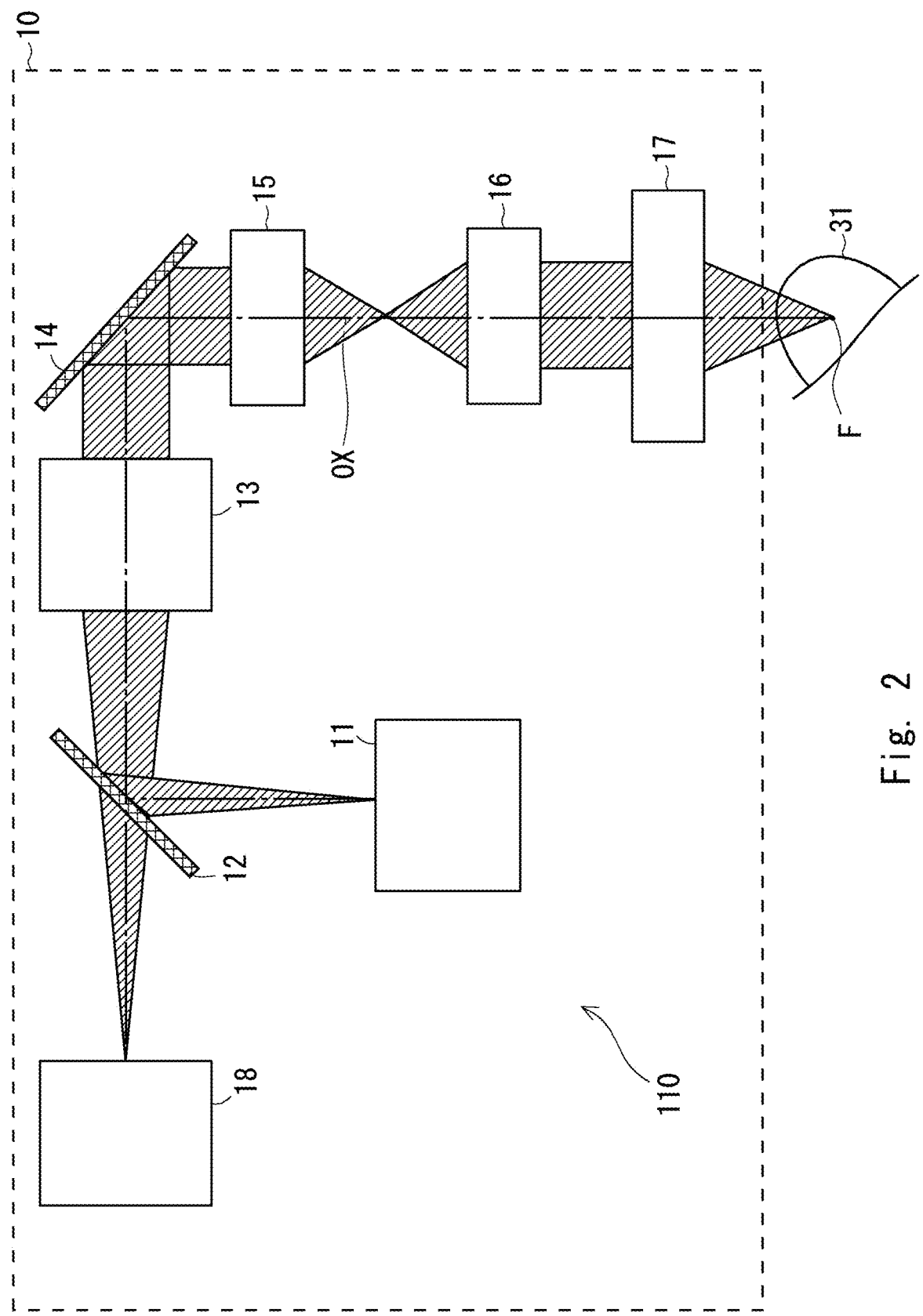
FIG. 2 shows an optical system provided in an optical head.

Next, a configuration of the optical head 10 is described with reference to FIG. 2. FIG. 2 shows a configuration of an optical system provided in the optical head 10. As described above, the optical head 10 is equipped with the line confocal optical system 110. The line confocal optical system 110 includes an illumination light source 11, a half mirror 12, a lens 13, a mirror 14, a lens 15, a lens 16, an objective lens 17, and a detector 18. These optical devices are fixed to a housing or the like (not shown) in the optical head 10. Further, the moving mechanism 40 rotationally moves the whole line confocal optical system 110.

Firstly, the illumination light optical system for illuminating the substrate 30 is described. The illumination light source 11 generates linear illumination light. Various types of light sources such as a lamp light source, an LED (Light Emitting Diode), and a laser light source can be used for the illumination light source 11. The illumination light source 11 is a line-light source. Alternatively, it is possible to generate linear illumination light by using a slit or a cylindrical lens.

In order to form the line confocal optical system 110, the illumination light forms a linear illumination area on a focal plane (or a focus plane) of the objective lens 17. Note that the focal plane is a plane that includes the focal point F and is perpendicular to the optical axis OX. On the focal plane, the long-side direction of the illumination area is defined as a Y-direction and the short-side direction thereof is defined as an X-direction. The X- and Y-directions are perpendicular to each other. It is assumed that the Y-direction is a direction on the RZ-plane shown in FIG. 1.

The illumination light emitted from the illumination light source 11 is incident on the half mirror 12. Half of the light incident on the half mirror 12 passes through the half mirror 12 and the remaining half thereof is reflected on the half mirror 12. The illumination light reflected on the half mirror 12 becomes a parallel luminous flux by the lens 13. The illumination light, which has become the parallel luminous flux, is incident on the mirror 14. The mirror 14 reflects the illumination light toward the lens 15. The illumination light is refracted by the lenses 15 and 16. The lenses 15 and 16 are, for example, relay lenses. The illumination light that has passed through the lens 16 becomes a parallel luminous flux.

The illumination light that has passed through the lens 16 is incident on the objective lens 17. The objective lens 17 concentrates the illumination light on the focal plane. A focal point F of the objective lens 17 is positioned at the edge part 31 of the substrate 30. The focal point F is located on the optical axis OX and inside the substrate 30. Therefore, the focal point F is deviated from the surface of the substrate 30 and is located inside thereof. The illumination light is reflected on a surface of the substrate 30.

Next, a detection optical system for detecting a reflected light reflected on the substrate 30 is described. The reflected light reflected on the substrate 30 goes back the optical path of the illumination light. That is, the reflected light becomes a parallel luminous flux by the objective lens 17 and is incident on the lens 16. The lenses 16 and 15 refract the reflected light. The reflected light that has passed through the lens 15 is reflected by the mirror 14 and is incident on the lens 13. Then, the reflected light is refracted by the lens 13 and is incident on the half mirror 12. Half of the reflected light from the lens 13 passes through the half mirror 12 and enters the detector 18.

The lens 13 is an imaging lens and concentrates the reflected light on a light receiving surface of the detector 18. The detector 18 is, for example, a line sensor including a plurality of pixels. Specifically, a line CCD (Charged Coupled Device) or a CMOS (Complementary Metal Oxide Semiconductor) line sensor can be used as the detector 18. Therefore, a plurality of pixels are arranged in a row on the light receiving surface of the detector 18. The plurality of pixels of the detector 18 are arranged along the Y-direction. The detector 18 detects the reflected light and outputs data on a detection result to the processing unit 50 (see FIG. 1). That is, the detector 18 outputs, for each pixel, detection data indicating intensity of the reflected light to the processing unit 50.

Note that the light receiving surface of the detector 18 is positioned in a place conjugate with the focal plane of the objective lens 17. The illumination light concentrated by the objective lens 17 forms a linear illumination area on the focal plane. On the light receiving surface of the detector 18, the reflected light is concentrated into a linear shape whose longitudinal direction is parallel to the Y-direction. The reflected light that has been reflected on a plane that is deviated from the focal plane in the optical-axis direction is incident on an area outside the pixels of the detector 18. In this way, the line confocal optical system 110 can be formed.

In the above-described example, the detector 18, which is the line sensor, is disposed in a place conjugate with the focal plane of the objective lens 17. However, it is also possible to form the line confocal optical system 110 by using a slit. For example, a slit that is formed along the linear illumination area is positioned at a place conjugate with the focal plane. The detector 18 is disposed behind the slit so as to detect reflected light that has passed through the slit. Here, it is assumed that the detector 18 is a line sensor in which a plurality of pixels are arranged along the direction of the slit. In this way, the reflected light reflected on the focal plane passes through the slit and the reflected light reflected on the plane deviated from the focal plane is shielded by the slit. In this way, the line confocal optical system can be formed. The detector 18 detects the reflected light through the confocal optical system and outputs detection data to the processing unit 50.

Figure 3:
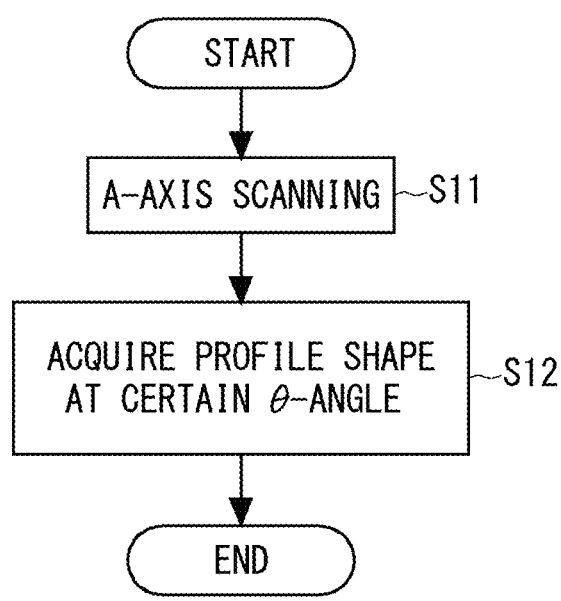
FIG. 3 is a flowchart showing a method for measuring an edge shape at a certain θ-angle.

Next, a measurement method according to this embodiment is described with reference to FIG. 3. FIG. 3 is a flowchart showing a method for measuring an edge shape. Note that for simplifying the explanation, a method for performing measurement without performing a θ-rotation by the stage 20 is described. That is, a method for measuring a profile of an edge shape at a certain θ-angle is described.

Firstly, the moving mechanism 40 scans (i.e., continuously or successively moves) the A-axis (S11). That is, the moving mechanism 40 rotationally moves the optical head 10. In this way, the optical head 10, in which the objective lens 17, the detector 18, and the like are disposed, is moved, so that the inclination of the optical axis OX is changed. The moving mechanism 40 changes the relative position of the optical head 10 with respect to the substrate 30 so that the inclination of the focal plane with respect to the substrate 30 is changed. For example, the moving mechanism 40 scans the A-axis angle in a range of −90° to +90°.

The processing unit 50 stores, for each A-axis angle of the moving mechanism 40, detection data detected by the detector 18. In this example, it is assumed that measurement is performed by scanning the A-axis angle with a pitch of 5° (i.e., at intervals of 5°). In this way, the detector 18 detects reflected light for each A-axis angle. Needless to say, the scanning range and the scanning pitch are not limited to any particular ranges and any particular pitches.

Then, the processing unit 50 acquires a profile shape at a certain θ-angle (S12). The processing unit 50 associates an A-axis angle and its detection data, and stores them. The processing unit 50 generates a profile shape of an edge based on detection data for each A-axis angle. The processing unit 50 measures (i.e., determines) a shape of an edge part based on the position of the detector 18 at which intensity of reflected light reaches a peak.

Figure 4:
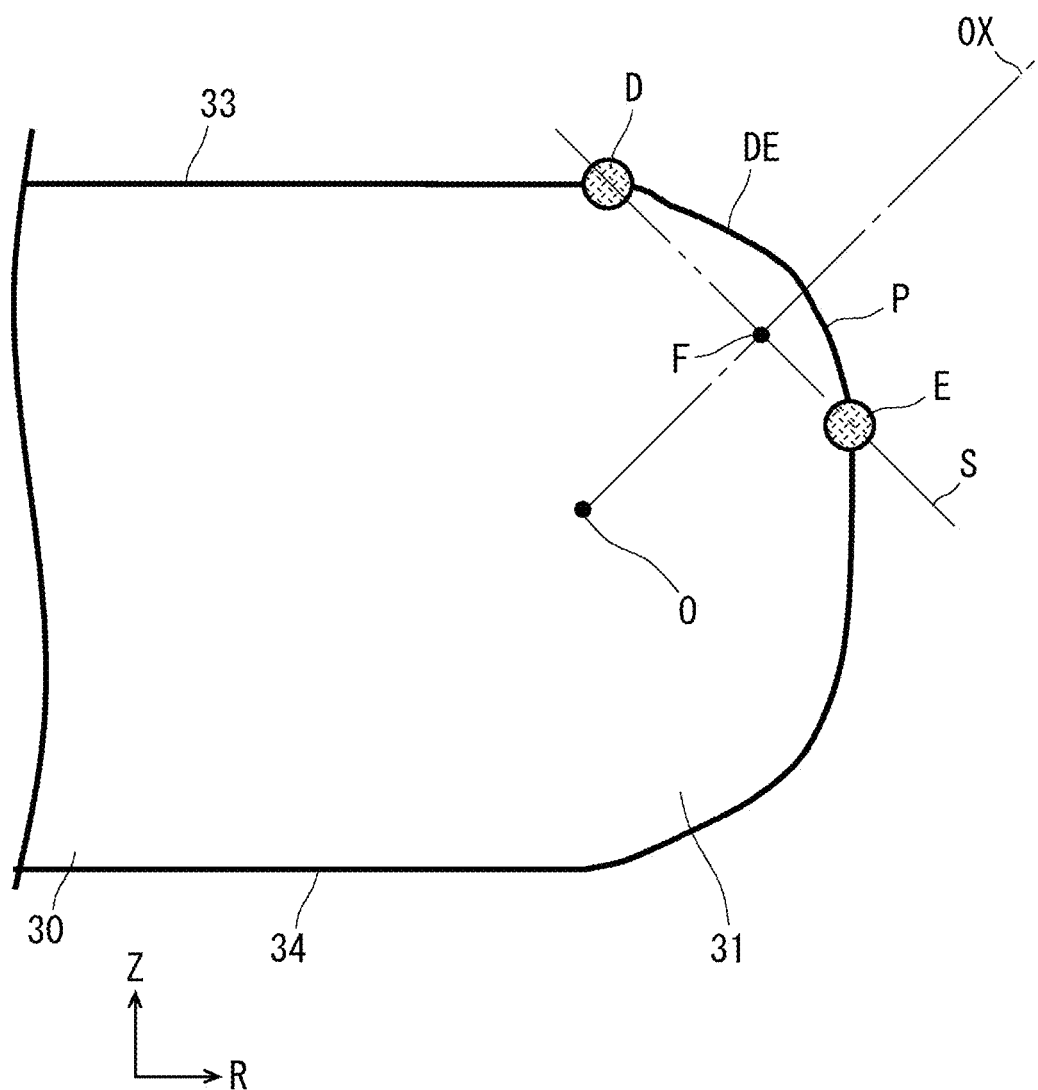
FIG. 4 is a diagram for explaining a method for measuring a profile of an edge.

A process for measuring a profile shape is described hereinafter with reference to FIG. 4. FIG. 4 schematically shows an edge profile P on an RZ-cross section. Note that the edge profile P is a profile line that is obtained by connecting edge positions with one another on a cross section of the substrate 30 along the RZ-plane.

The RZ-plane is a measurement plane of the edge profile P. The focal point F is located on the optical axis OX of the objective lens 17 (not shown in FIG. 4) and is located inside the edge profile P of the substrate 30. That is, the focal point F is a point located inside the substrate 30. A plane that includes the focal point F and is perpendicular to the optical axis OX is a focal plane S. The center O of the rotational movement around the A-axis is located on the optical axis OX. Further, the optical axis OX is located on (i.e., parallel to) the RZ-plane. The center O is deviated from the focal point F. In this example, the focal point F is closer to the objective lens 17 than the center O is. Therefore, on the optical axis OX, the edge profile P (equivalent to the edge position), the focal point F (equivalent to the focal plane S), and the center O are arranged in this order as viewed from the objective lens.

As described above, on the focal plane S, the objective lens 17 concentrates illumination light so that the illumination light has a linear shape along the Y-direction. The Y-direction is a direction on the RZ-plane (i.e., a direction parallel to the RZ-plane). Therefore, as shown in FIG. 4, the focal plane S obliquely cuts across an edge of the substrate 30. On the RZ-plane, two points at which the focal plane S cuts across the edge profile P are referred to as edge positions D and E. On the RZ-plane, the edge positions D and E are intersection points between the edge profile P and the focal plane S.

Specifically, the edge positions D and E are disposed on both sides of the optical axis OX. The edge position D is located on the Z-axis positive side of the focal point F and the edge position E is located on the Z-axis negative side of the focal point F. The edge positions D and E are illuminated. In the edge profile P, a range from the edge position D to the edge position E is referred to as a range DE. Note that the range DE is a range that does not include the edge positions D and E. The range DE is illuminated by the illumination light. However, in the range DE, the edge profile P is deviated from the focal plane S to the objective lens side. Therefore, because of the confocal effect, the intensity of the reflected light reflected in the range DE, detected by the detector 18 is significantly low.

A range that extends from the edge position D toward the front surface 33 is deviated from the focal plane S. Similarly, a range that extends from the edge position E toward the rear surface 34 is also deviated from the focal plane S. Therefore, even if the range that extends from the edge position D toward the front surface 33 and the range that extends from the edge position E toward the rear surface 34 are illuminated, no reflected light is detected. Therefore, in the state shown in FIG. 4, the intensity of the reflected light reflected on the edge positions D and E is extremely high. That is, regarding the intensity of the light detected by the detector 18, the reflected light from the two intersection points (i.e., the edge positions D and E) between the focal plane S and the edge profile P is dominant.

Figure 5:
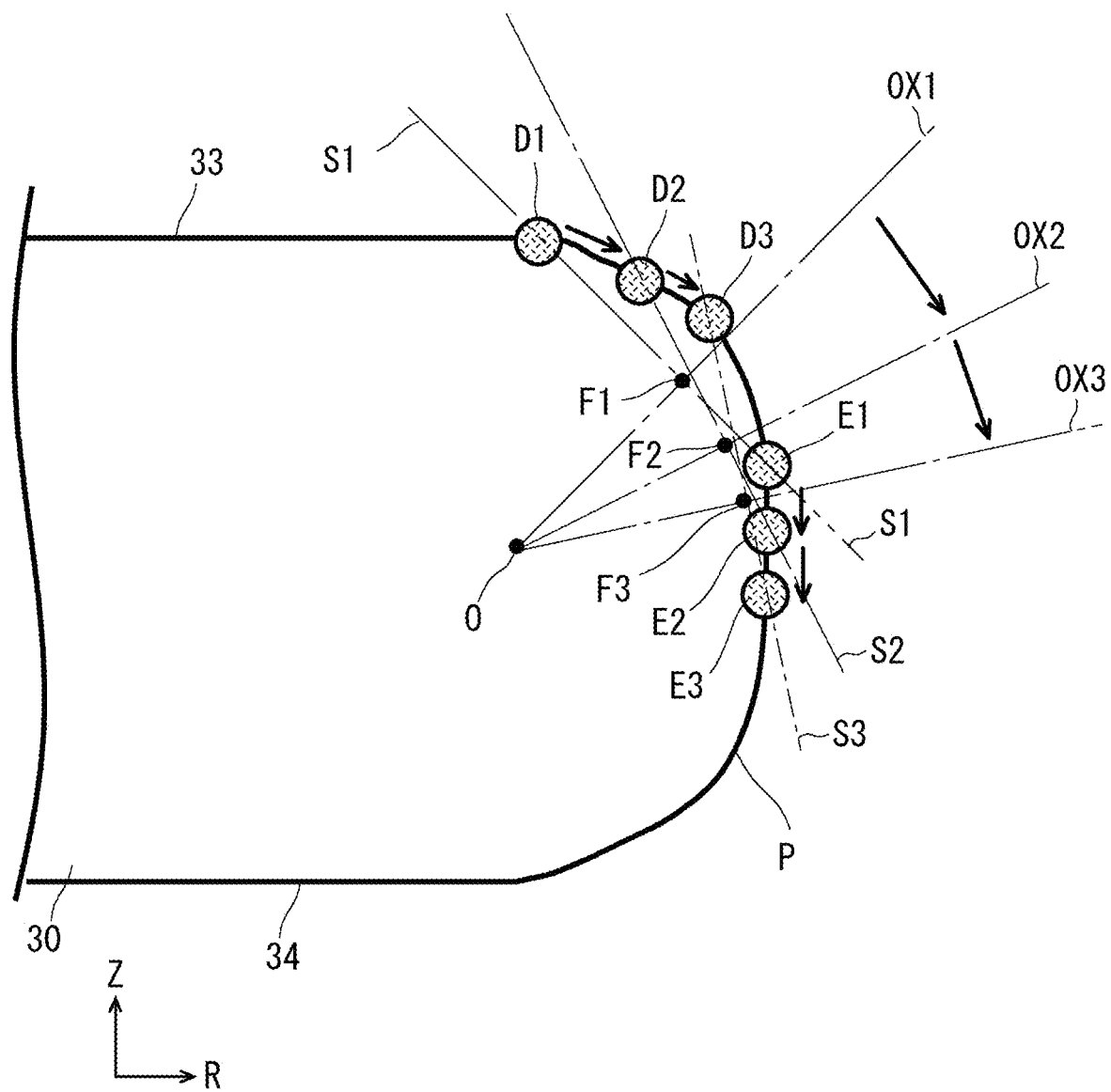
FIG. 5 shows positions of focal planes when an A-axis angle is changed.

FIG. 5 is a diagram for explaining changes in the focal plane S and the edge positions D and E when the optical head 10 is rotationally moved around the A-axis. In FIG. 5, the optical axis OX, the focal point F, the focal plane S, the edge positions D, and the edge position E shown in FIG. 4 are indicated by an optical axis OX1, a focal point F1, a focal plane S1, an edge position D1, and an edge position E1. Further, it is assumed that the optical axis OX1 is successively shifted to an optical axis OX2 and to an optical axis OX3 through rotational movements around the A-axis. In this case, the focal plane S is also successively changed from the focal plane S1 to a focal plane S2 and to a focal plane S3. That is, through the rotational movements around the A-axis, the inclination of the optical axis OX changes, so that the inclination of the focal plane S also changes. The focal point F is also successively changed from the focal point F1 to a focal point F2 and to a focal point F3.

The edge positions D2 and E2 are intersection points between the focal plane S2 and the edge profile P. The edge positions D3 and E3 are intersection points between the focal plane S3 and the edge profile P. The edge position D is successively shifted from the edge position D1 to the edge position D2 and to the edge position D3 by the rotational movement around the A-axis. Similarly, the edge position E is successively shifted from the edge position E1 to the edge position E2 and to the edge position E3. Therefore, it is possible to gradually change the edge position by gradually changing the A-axis angle.

The edge profile P can be measured by obtaining the edge positions D and E for each A-axis angle. That is, the edge profile P on the RZ-plane can be obtained by connecting the edge positions D and E which are measured by changing the A-axis angle. In this embodiment, measurement is performed in the state in which the focal point F is deviated from the edge position on the optical axis OX. Specifically, measurement is performed in the state in which, even when the axis A is changed, the edge position is closer to the objective lens than the focal point F is. In other words, measurement is performed in the state in which the focal plane S always cuts across the edge irrespective of the A-axis angle.

The edge positions D and E, which are deviated from the optical axis OX and are located on the focal plane S, are illuminated by the illumination light. Then, the detector 18 detects the reflected light from these edge positions D and E through the confocal optical system.

Figure 6:
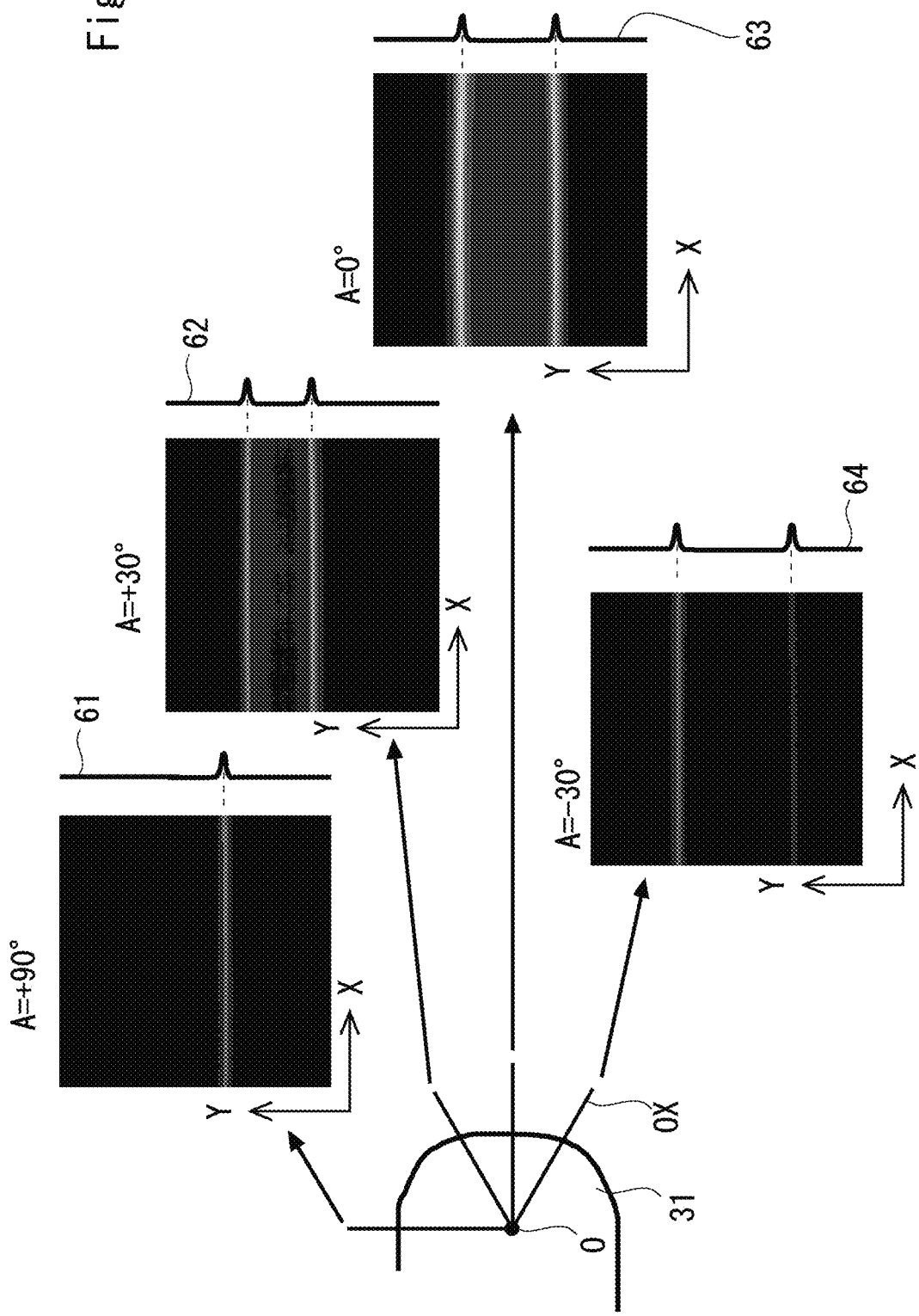
FIG. 6 shows confocal images and Y-direction profiles according to the A-axis angle.
Figure 7:
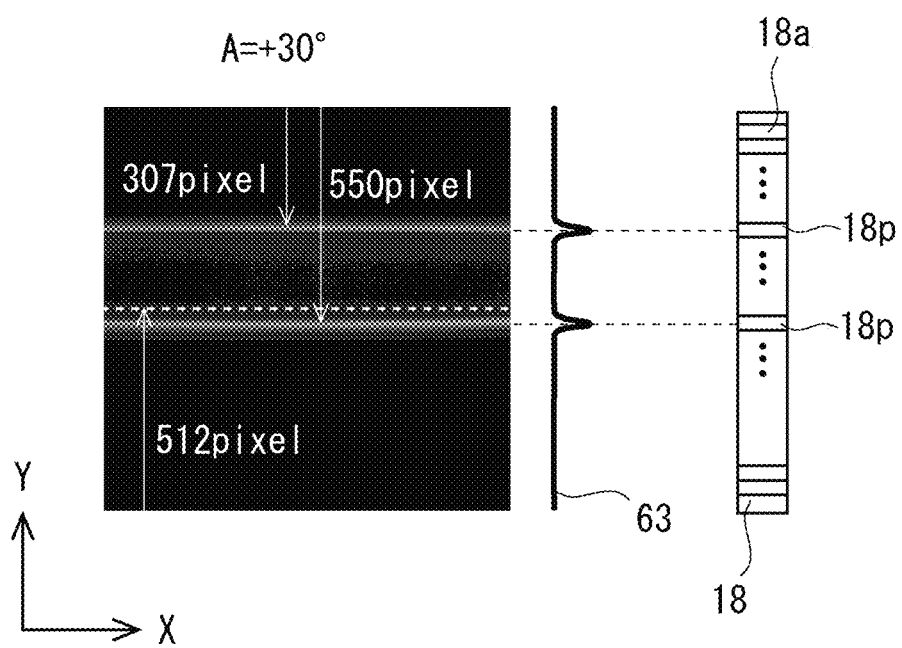
FIG. 7 shows peak positions when the A-axis angle is +30°.

Next, a process for obtaining edge positions D and E from detection data obtained by the detector 18 is described. FIG. 6 shows confocal images of the edge part 31 and detection data thereof. FIG. 6 shows confocal images that are obtained when A=+90°, +30°, 0° and −30°, and detection data of reflected light. FIG. 7 shows the confocal image obtained when A=+30° and detection data of reflected light in an enlarged manner.

Note that the confocal images shown in FIG. 6 are two-dimensional images obtained by scanning (i.e., successively moving) liner illumination light in the X-direction. Specifically, they are images obtained by scanning the illumination light by using the mirror 14 shown in FIG. 2 as an optical scanner such as a galvanometer mirror. The actual measurement of the edge shape is carried out without taking confocal images. In other words, scanning by the optical scanner is unnecessary.

Detection data of the reflected light is schematically shown on the right side of each confocal image. Note that data on the intensity of the reflected light obtained when A=+90°, +30°, 0° and −30° are indicated as detection data 61, 62, 63 and 64, respectively. The detection data 61 to 64 indicate profiles of the intensity of the reflected light along the Y-direction.

As shown in FIG. 7, the processing unit 50 identifies, among the pixels 18a of the detector 18, a pixel(s) in which the intensity of the reflected light is the highest as a peak pixel(s) 18p. Then, the processing unit 50 determines the pixel position of the peak pixel 18p as the peak position. The peak position is obtained in the Y-direction profile of the intensity of the reflected light acquired for each A-axis angle. The edge position D corresponds to 307 (pixel) and the edge position E corresponds to 550 (pixel). For example, the center pixel of the detector 18 corresponds to 512 (pixel). That is, the pixel positions are represented by integers of 0 to 1,024.

As shown in FIG. 7, the processing unit 50 identifies, among the pixels 18a of the detector 18, a pixel(s) in which the intensity of the reflected light is the highest as a peak pixel(s) 18p. Then, the processing unit 50 determines the pixel position of the peak pixel 18P as the peak position. The peak position is obtained in the Y-direction profile of the intensity of the reflected light acquired for each A-axis angle. The edge position D corresponds to 307 (pixel) and the edge position E corresponds to 550 (pixel). For example, the center pixel of the detector 18 corresponds to 512 (pixel). That is, the pixel positions are represented by integers of 0 to 1,024.

Note that as shown in FIG. 6, when the A-axis angle is +90°, only one peak appears in the detection data 61. This is because the edge position D goes out of the field of view of the detector 18. That is, on the RZ-plane, an angle formed by the focal plane S and the edge profile P becomes small near the front surface 33 or the rear surface 34. As a result, the distance from the optical axis OX to the edge position D or E increases. When the focal plane S and the edge profile P become almost parallel to each other, the edge position D or E goes out of the field of view of the detector 18.

Therefore, only one peak may appear when the A-axis angle is close to +90° or −90°. In this case, the processing unit 50 may obtain only one peak position. Alternatively, neither of the two peaks may appear when the A-axis angle is close to +90° or −90°. In this case, the processing unit 50 may obtain no peak position.

Figure 8:
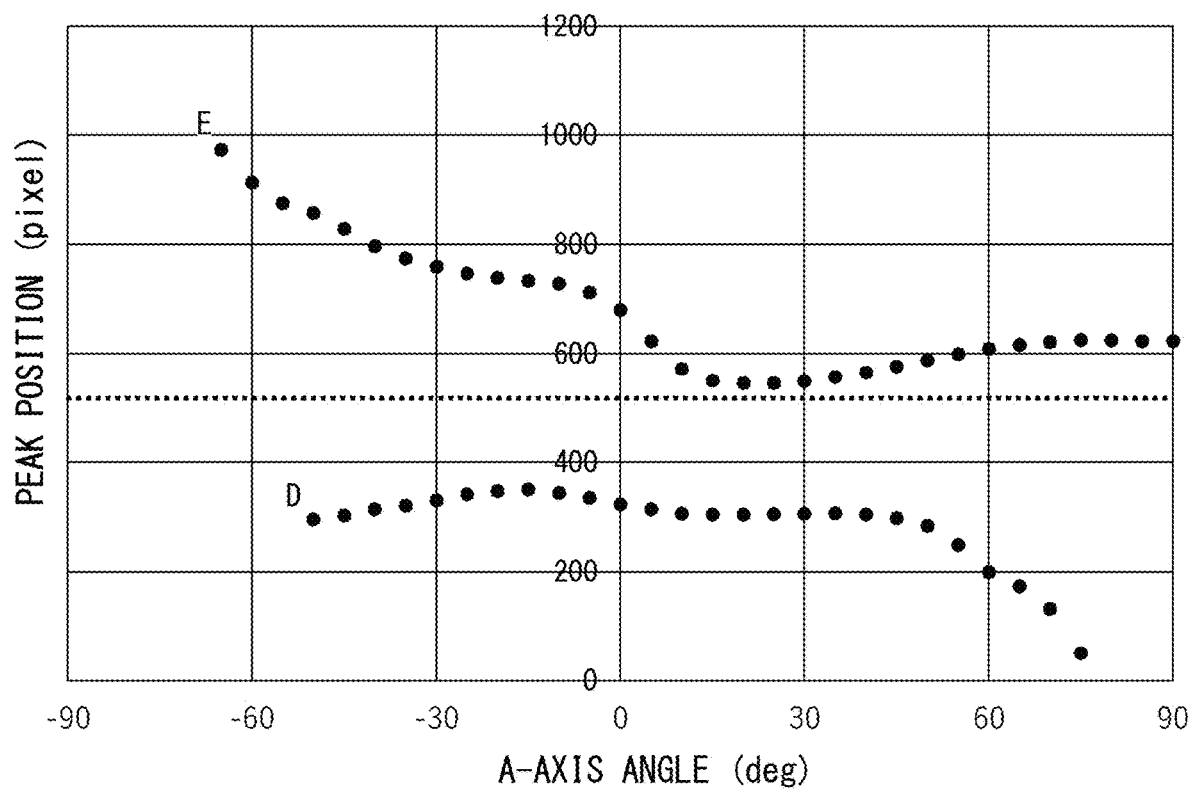
FIG. 8 is a graph showing a peak position for each A-axis angle.

FIG. 8 is a graph showing peak positions for each A-axis angle. In FIG. 8, a horizontal axis indicates A-axis angles (deg) and a vertical axis indicates peak positions (pixel). FIG. 8 shows a measurement result when the A-axis angle is changed at intervals of 5°. For each angle, peak positions corresponding to the edge positions D and E are plotted. Data above the center pixel (512) corresponds to the edge position E and data below the center pixel (512) corresponds to the edge position D.

When the A-axis angle is close to +90°, no peak corresponding to the edge position D appears. Therefore, no peak position corresponding to the edge position E is plotted. Further, when the A-axis angle is close to −90°, no peak corresponding to the edge positions D and E appears. Therefore, no peak position is plotted.

Figure 9:
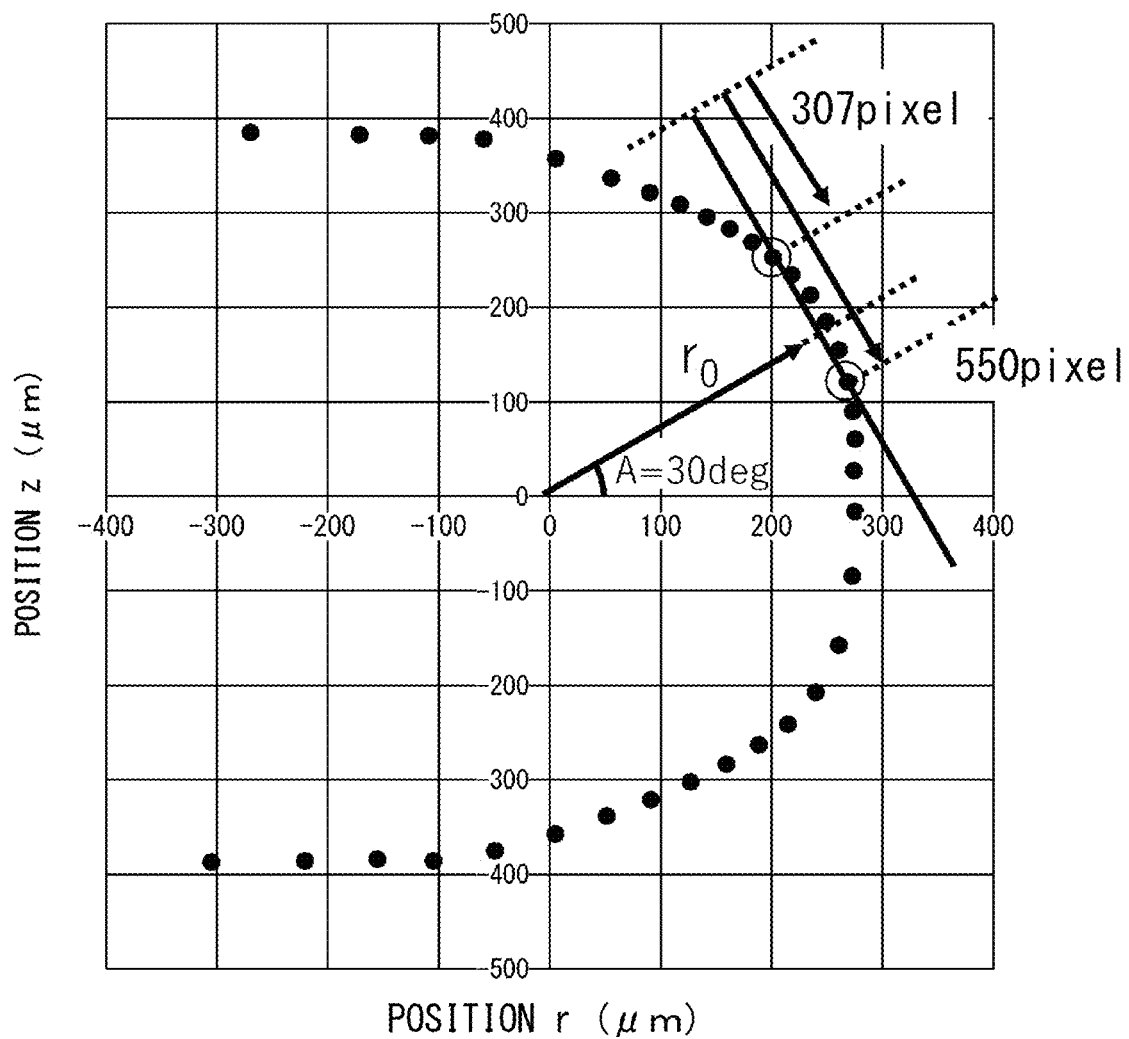
FIG. 9 shows edge positions on an RZ-plane.

Peak positions can be converted into positions (coordinates) on the RZ-plane. Specifically, the processing unit 50 geometrically obtains R-positions and Z-positions from peak positions (pixel) by using the A-axis angle and the setting of the optical system. FIG. 9 is a graph in which the peak positions (pixel) shown in FIG. 8 are converted into R-positions and Z-positions.

For example, the following Expressions (1) and (2) are conversion formulas for calculating an R-position (R1) and a Z-position (Z1) from peak positions (pixel).

$$R1 = r0*\cos(A) + (p1-pc)*k*\sin(A) \qquad (1)$$

$$Z1 = r0*\sin(A) - (p1-pc)*k*\cos(A) \qquad (2)$$

In the Expressions, r0 is a distance (μm) from the center O to the focal point F; A is an A-axis angle; p1 is a detected pixel position (pixel); and pc is the central axis position (pixel) of the detector 18. Further, k (μm/pixel) is a size of one pixel on the focal plane and is obtained from the pixel size, the magnification, and the like of the detector 18. The R- and Z-positions of the edge position D or E can be calculated from the Expressions (1) and (2). Note that the R- and Z-positions correspond to coordinates (R, Z) in the R- and Z-directions when the center O is defined as the origin point (0, 0).

For example, when A=+30°, the edge positions D and E correspond to 307 (pixel) and 550 (pixel), respectively. The R-position (R1) and the Z-position (Z1) can be obtained by substituting these values for p1 in the Expressions (1) and (2), respectively.

Figure 10:
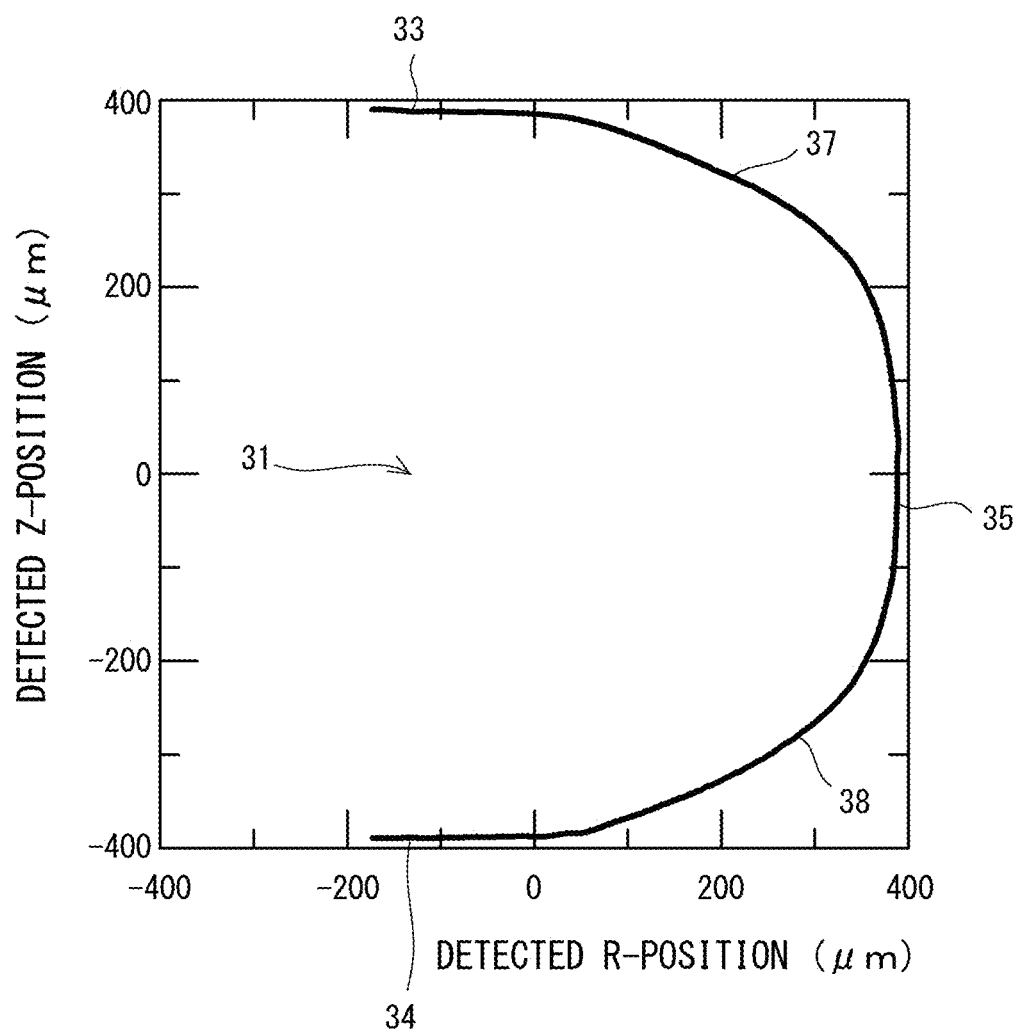
FIG. 10 shows a measured edge profile.

FIG. 10 is a graph showing an edge shape obtained by measuring the edge part 31 of the substrate 30. That is, FIG.

10 shows a shape that is obtained by connecting measurement data of a plurality of edge positions D and E with one another.

As described above, the R- and Z-positions can be obtained from the edge position D by using the Expressions (1) and (2). Similarly, the R- and Z-positions can be obtained from the edge position E by using the Expressions (1) and (2). Note that when there is a large difference between the R- and Z-positions obtained from the edge position D and those obtained from the edge position E, a calibration may be performed. For example, a calibration value(s) may be added to the R- and Z-positions obtained from the edge position D so that they coincide with counterpart positions. Alternatively, a calibration value(s) may be added to the R- and Z-positions obtained from the edge position E.

Note that in FIG. 10, an end surface along the direction perpendicular to the front surface 33 and the rear surface 34 of the substrate 30 is referred to as a side-end surface 35. An inclined surface between the side-end surface 35 and the front surface 33 is referred to as an upper bevel part 37 and an inclined surface between the side-end surface 35 and the rear surface 34 is referred to as a lower bevel part 38.

As described above, an edge profile on the RZ-cross section can be obtained by measuring the edge positions D and E while changing the A-axis angle. The processing unit 50 obtains the edge profile based on a detection result obtained by the detector 18. Specifically, peak positions of the intensity of the reflected light in the detector 18 are converted into position coordinates on the RZ-plane. In this way, the edge profile can be accurately measured.

Since the edge profile can be measured just by changing the A-axis, the configuration of the apparatus can be simplified. In the confocal optical system, it is possible to measure the edge shape without scanning (i.e., continuously or successively moving) the objective lens 17 in the optical-axis direction. That is, it is possible to perform the measurement without adjusting the height of the focal point. Therefore, it is possible to accurately measure the edge shape in a short time.

Figure 11:
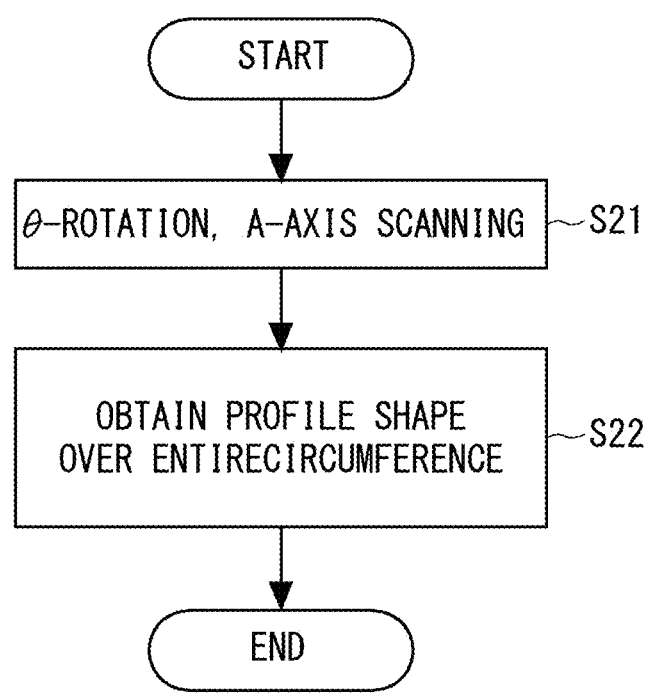
FIG. 11 is a flowchart showing a method for measuring an edge shape over the entire circumference.

Further, it is possible to measure the edge shape over the entire circumference of the substrate 30 by measuring the edge positions D and E while rotating the stage 20 shown in FIG. 1. FIG. 11 is a flowchart showing a method for measuring an edge shape over the entire circumference.

Firstly, the θ-rotation and the scanning of the A-axis are performed (S21). Specifically, the processing unit 50 rotates the stage 20 at a constant speed so that the rotational speed of the stage 20 is continuously changed. Further, the processing unit 50 controls the moving mechanism 40 so that the A-axis angle is continuously changed or is changed in a stepwise manner. Then, a profile shape over the entire circumference of the substrate 30 is measured (S22). The processing unit 50 collects the A-axis angle and the θ-angle as well as detection data detected by the detector 18. Therefore, by using the above-described technique, an edge position for each θ-angle and for each A-axis angle can be measured.

Note that the rotational speed of the stage 20 may be 5 rps. Further, it is assumed that a measurement time for one substrate 30 is, for example, 30 seconds. In this case, the substrate 30 rotates 150 times during the measurement. Therefore, there are 150 measurement points on each RZ-plane.

As described above, the edge position over the entire circumference can be measured by detecting the reflected light while rotating the stage 20. Further, the edge shape over the entire circumference of the substrate 30 can be measured by changing the A-axis angle. Therefore, it is possible to evaluate variations among edge shapes. Further, it is possible to measure the edge shape over the entire circumference of one substrate 30 in a short time of about 30 seconds. Therefore, it is possible to accurately measure the edge shape in a short time.

Note that the above-described processes are performed in the processing unit 50. Specifically, the above-described arithmetic processing can be carried out by having a processor provided in the processing unit 50 execute a computer program. Needless to mention, a part of or all of the processing may be carried out by using hardware such as an analogue circuit or the like. Note that the processing unit 50 is not limited to a physically single apparatus and part of the processing may be carried out by a physically different apparatus.

Figure 12:
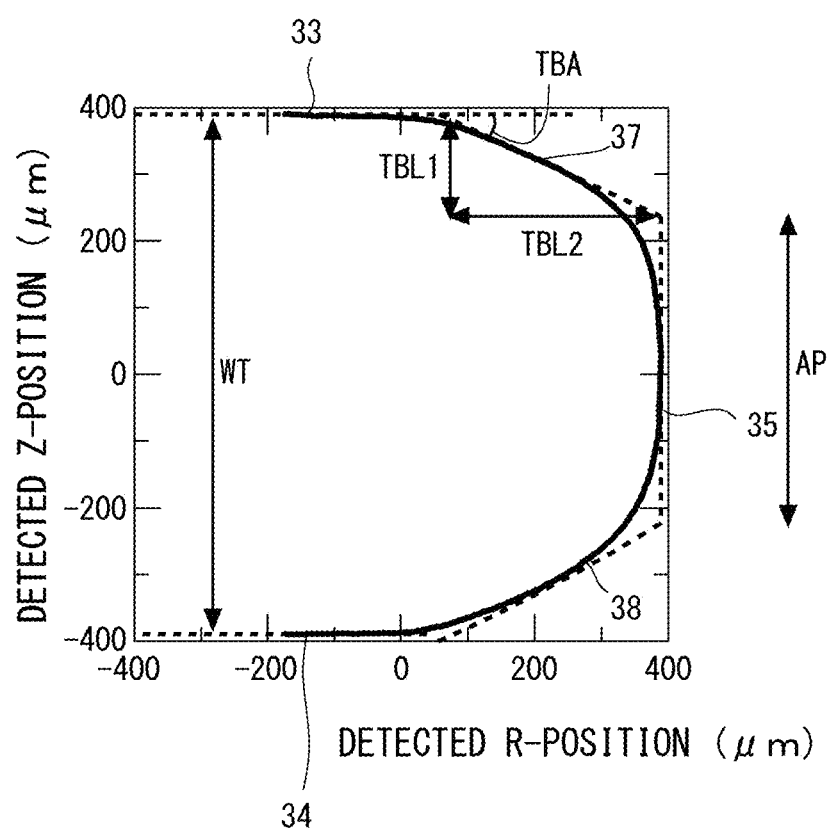
FIG. 12 is a diagram for explaining feature values of an edge part.

Next, a measurement result of an edge shape over the entire circumference is described. FIG. 12 is a diagram for explaining feature values of each part of the edge part. As shown in FIG. 12, the thickness of the substrate in the Z-direction is referred to as a wafer thickness WT. The height of the side-end surface 35 of the edge part 31 in the Z-direction is referred to as an APEX length AP. The angle formed between the upper bevel part 37 and the front surface 33 is referred to as a TB (Top Bevel) angle TBA. The height of the upper bevel part 37 in the Z-direction is referred to as a TB height TBL1 and the width of the upper bevel part 37 in the R-direction is referred to as a TB width TBL2.

Figure 13:
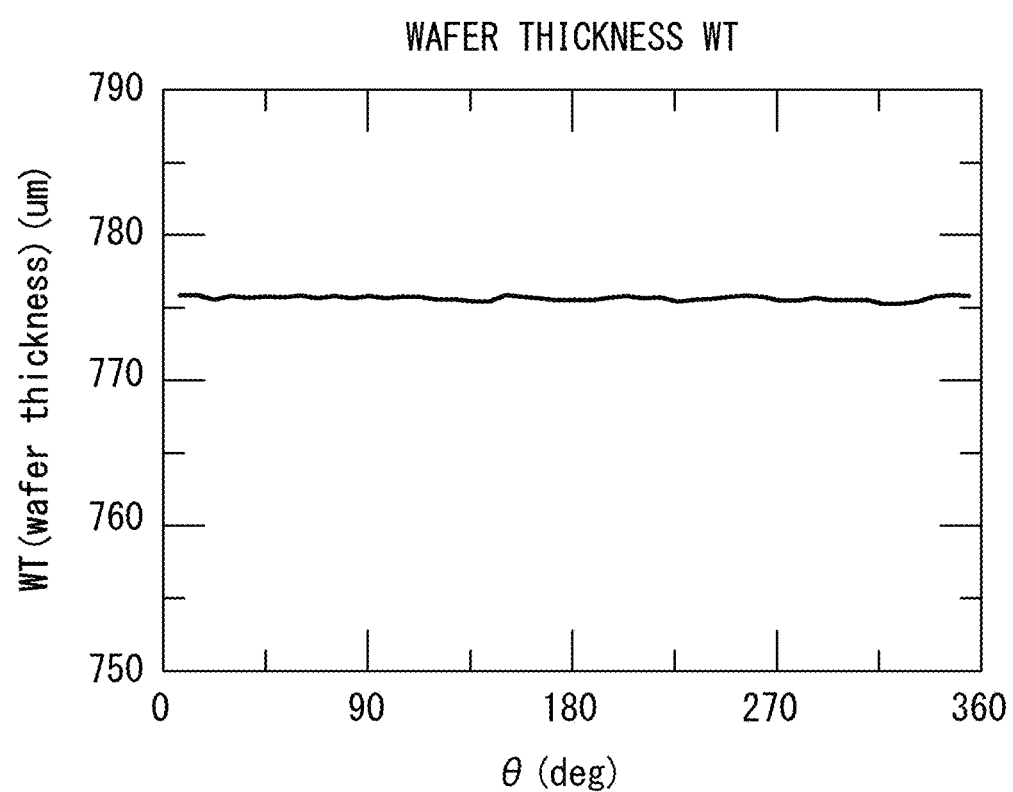
FIG. 13 is a graph showing changes in a wafer thickness WT according to a θ-angle.
Figure 14:
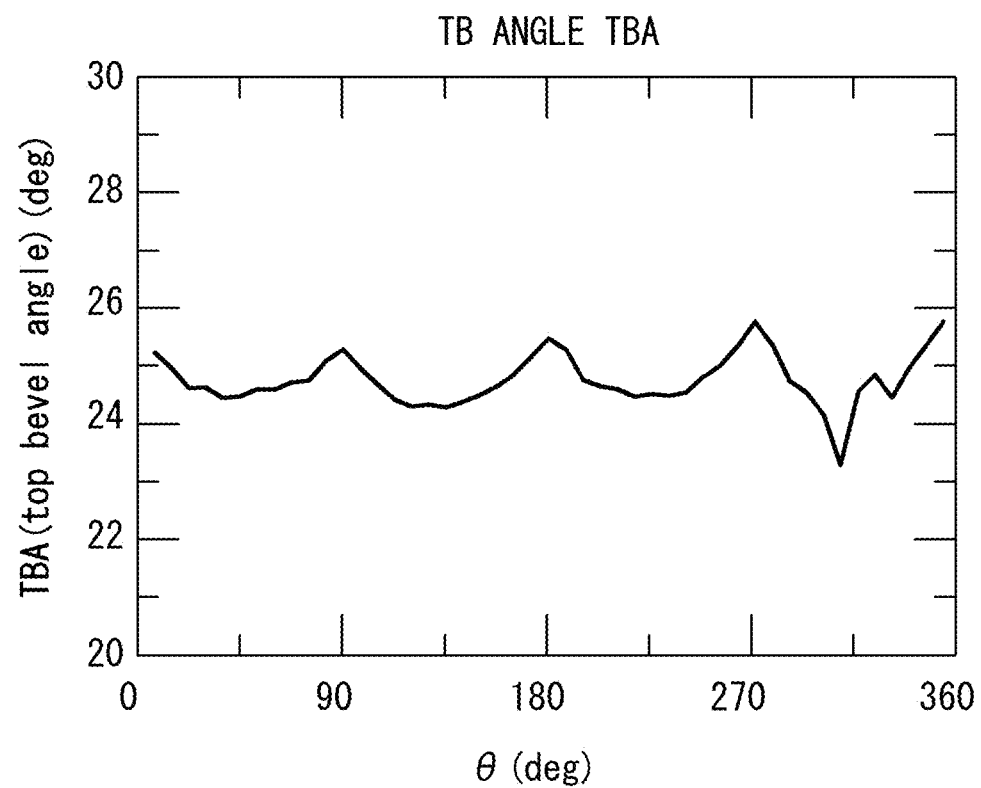
FIG. 14 is a graph showing changes in a TB angle TBA according to the θ-angle.

FIGS. 13 to 16 are graphs showing θ-dependence of feature values representing the edge shape. FIG. 13 is a graph showing changes in the wafer thickness WT according to the θ-angle. In FIG. 13, a horizontal axis indicates θ-angles and a vertical axis indicates wafer thicknesses WT. FIG. 14 shows changes in the TB angle TBA according to the θ-angle. In FIG. 14, a horizontal axis indicates θ-angles and a vertical axis indicates TB angles TBA.

Figure 15:
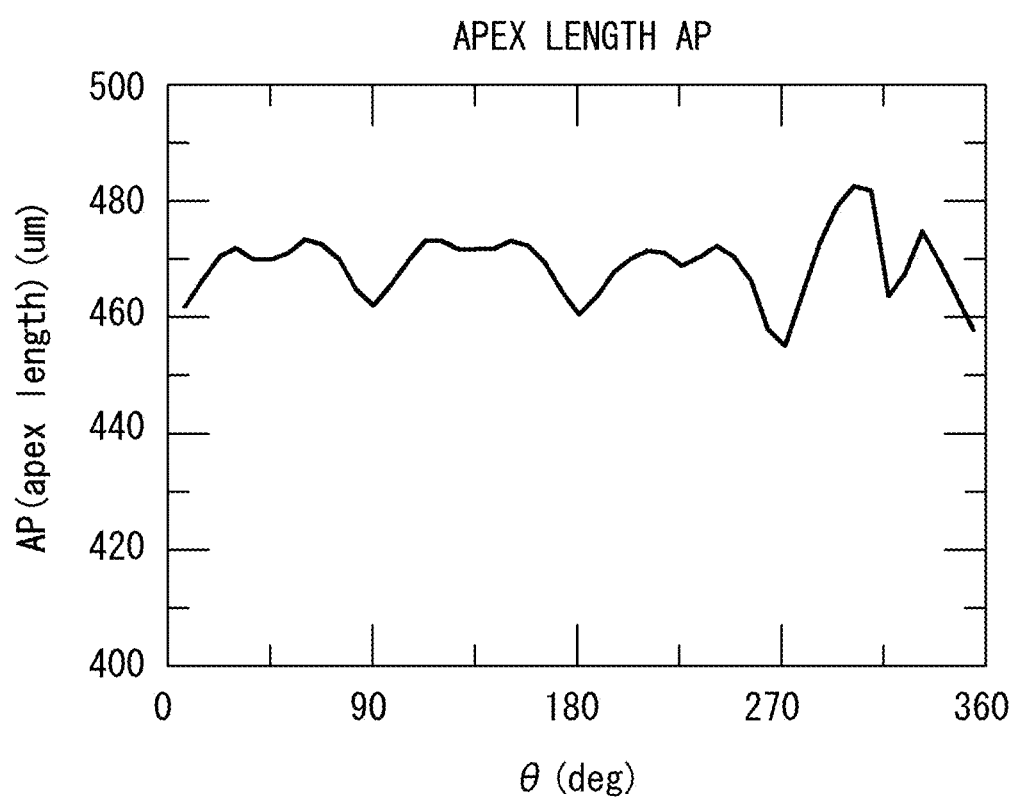
FIG. 15 is a graph showing changes in an APEX length AP according to the θ-angle.
Figure 16:
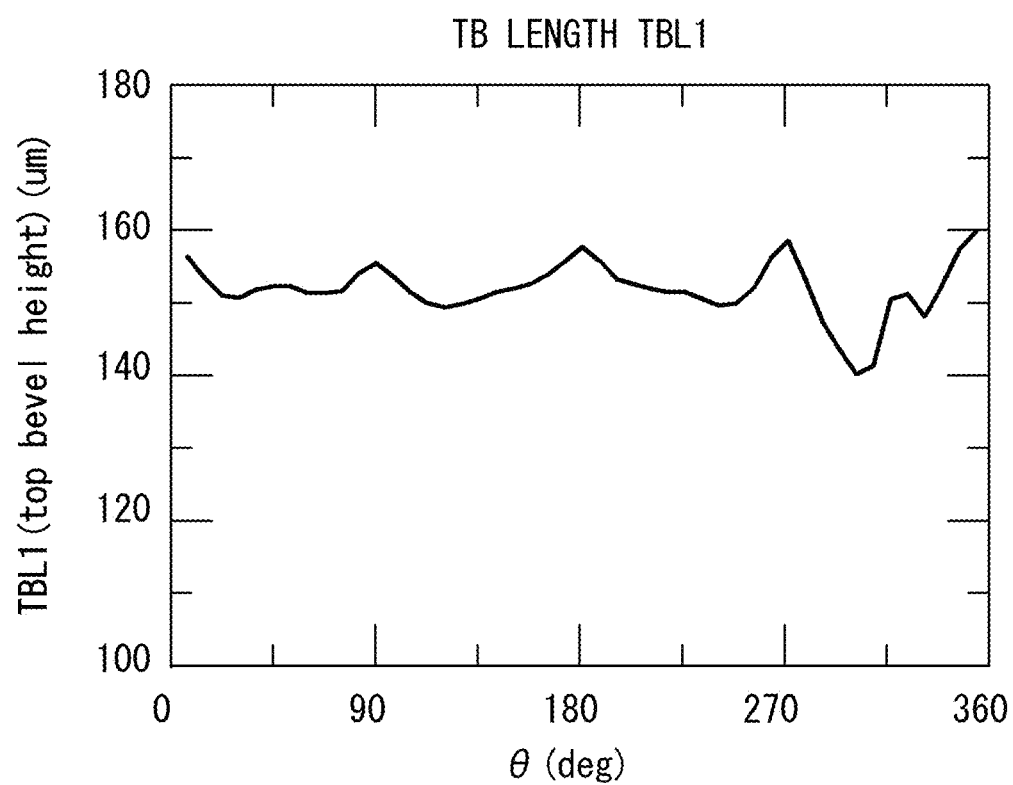
FIG. 16 is a graph showing changes in a TB height TBL1 according to the θ-angle.

FIG. 15 is a graph showing changes in the APEX length AP according to the θ-angle. In FIG. 15, a horizontal axis indicates θ-angles and a vertical axis indicates APEX lengths AP. FIG. 16 is a graph showing the TB height TBL1 according to the θ-angle. In FIG. 16, a horizontal axis indicates θ-angles and a vertical axis indicates TB heights TBL1. As described above, the processing unit 50 can display the θ-dependence of feature values representing the edge shape in the form of a graph.

As described above, it is possible to acquire detailed shape data on the edge shape over the entire periphery of the wafer. In the measurement method according to the present embodiment, it is possible to acquire a sufficient number of detection data in a short time. Therefore, it is possible to obtain data on feature values such as the wafer thickness WT, the APEX length AP, the TB angle TBA, the TB height TBL1, and the TB width TBL2 over the entire circumference.

The processing unit 50 can display such feature values in the form of a two-dimensional graph. For example, the processing unit 50 displays a graph in which a horizontal axis indicates θ-angles and a vertical axis indicates feature values in a monitor. By displaying the θ-dependence of feature values according to the edge position in the form of a graph, a user can easily recognize variations of edge shapes and a distribution thereof. Therefore, the user can appropriately evaluate and manage quality of the edge part 31.

Figure 17:
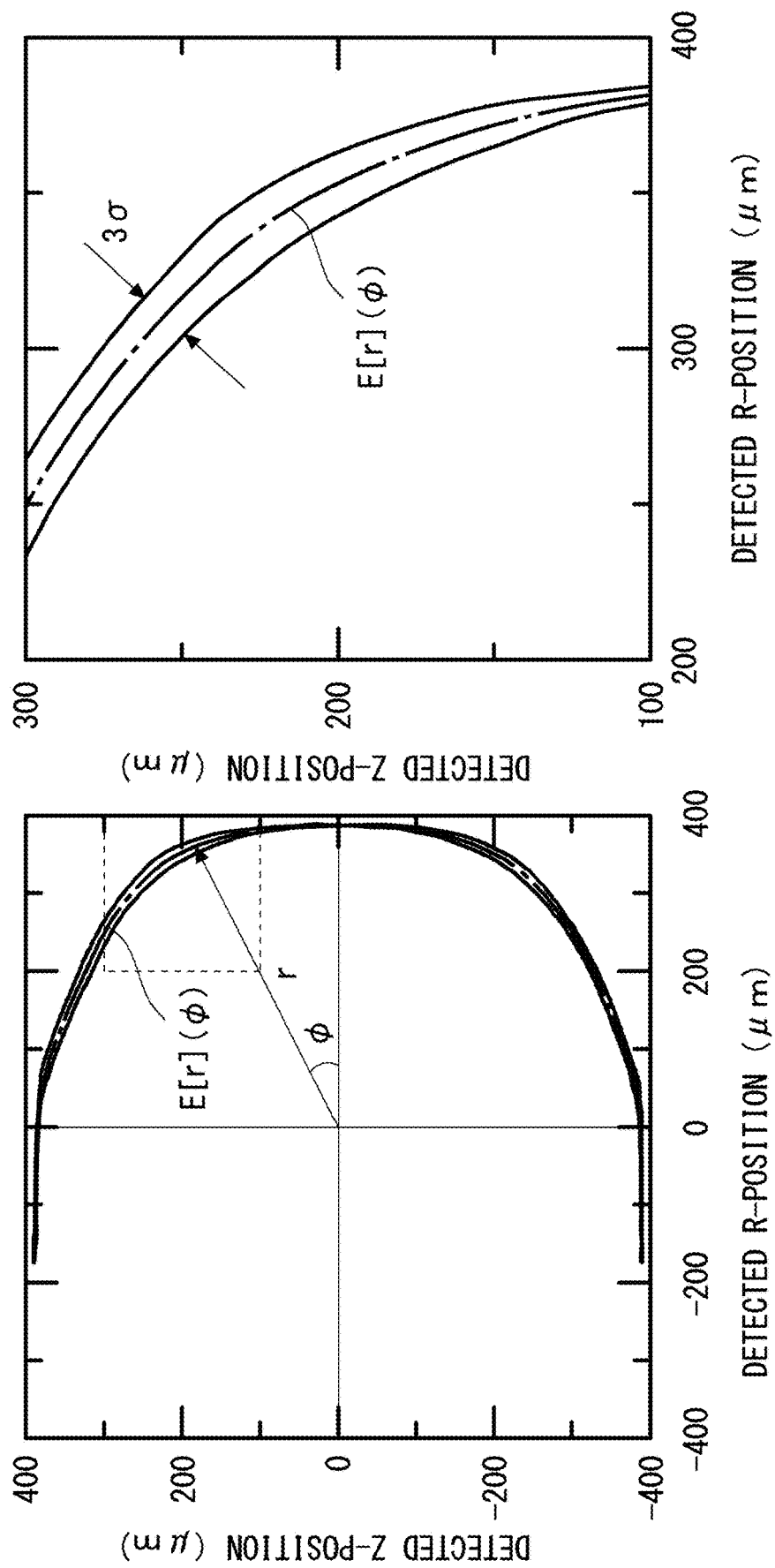
FIG. 17 shows an average profile of an edge.

FIG. 17 shows an average profile $E[r](\varphi)$ and $\pm 3\sigma$ profiles of an edge over the entire circumference. In FIG. 17, the average profile $E[r](\varphi)$ and the $\pm 3\sigma$ profiles at the edge position are shown on the left side. Further, in FIG. 17, parts of the profiles are shown in an enlarged manner on the right side. Note that the average profile E[r](φ) corresponds to an edge position that is obtained by averaging data for θ=0° to 360°.

Figure 18:
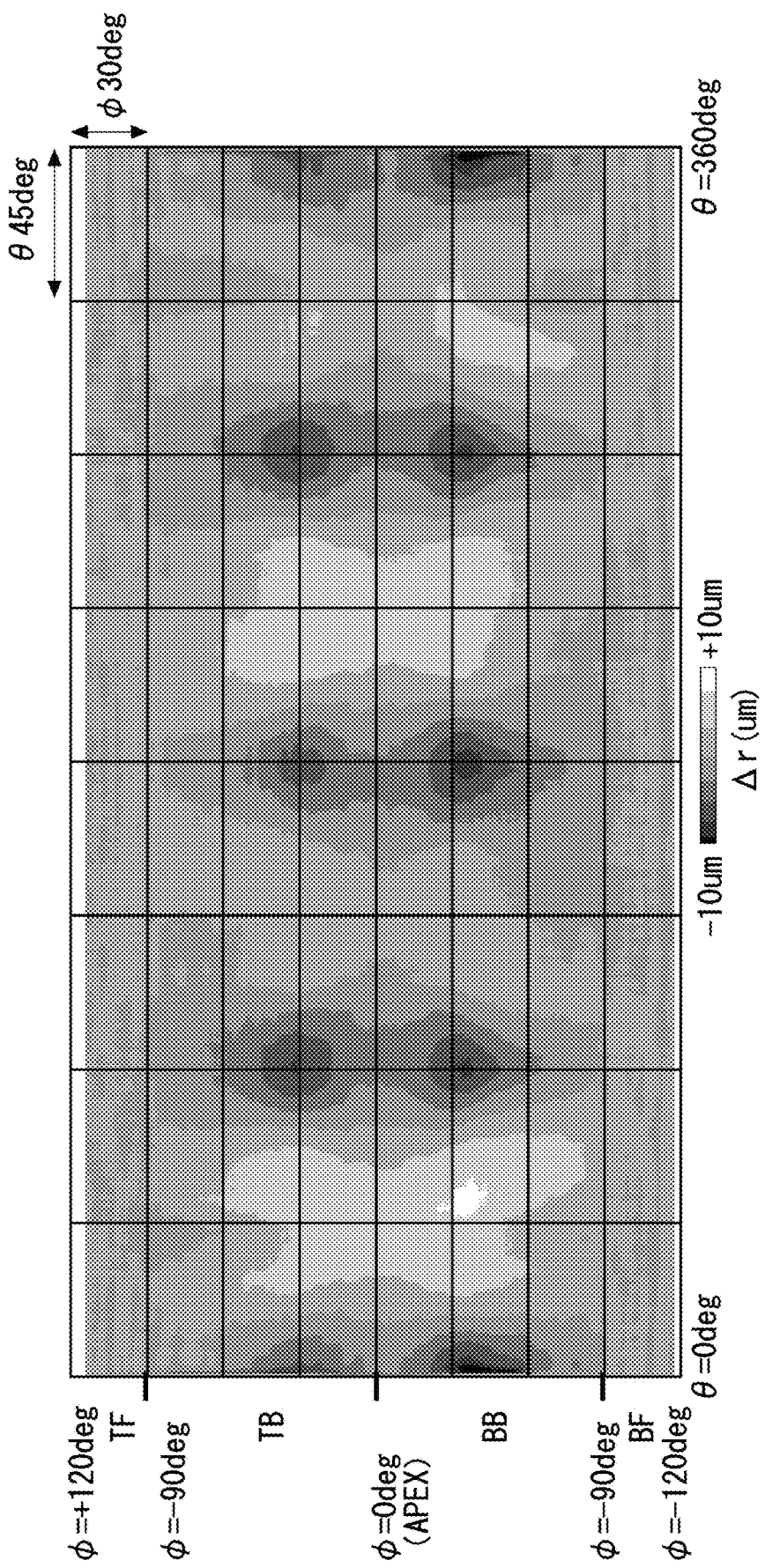
FIG. 18 shows unevenness data of an edge.

FIG. 18 is a graph showing two-dimensionally extended unevenness data Δr(θ, φ) of the edge position over the entire circumference. In FIG. 18, a horizontal axis indicates angles θ and a vertical axis indicates angles φ. The unevenness data Δr(θ, φ) is data indicating deviations of the radius r from the average profile E[r](φ). In particular, the unevenness data Δr(θ, φ) is expressed by the following Expression (3).

The average profile E[r](φ) is obtained by averaging the whole data on the radius r obtained in a range of 0 to 360°. For example, the processing unit 50 obtains an average value and a standard deviation σ of the radius r for every angle φ. Then, the average value of the radius r according to the angle φ becomes the average profile E[r](φ). The profiles for ±3σ correspond to E[r](φ)+3σ[r](φ) and E[r](φ)−3σ[r](φ).

Based on FIG. 17, it is understood that the standard deviation σ is large in the bevel part of the edge part 31. That is, variations of the edge position in the φ-direction are large in the bevel part. The processing unit 50 displays, as feature values, the average profile E[r](φ) and the profiles for ±3σ in a two-dimensional graph. A user can easily recognize the variations of the edge shape and the distribution thereof. Therefore, the user can appropriately evaluate and manage quality of the edge part 31.

FIG. 18 is a graph showing two-dimensionally extended unevenness data Δr(θ, φ) of the edge position over the entire circumference. In FIG. 18, a horizontal axis indicates angles θ and s vertical axis indicates angles φ. The unevenness data Δr(θ, φ) is data indicating deviations of the radius r from the average profile E[r](φ). In particular, the unevenness data Δr(θ, φ) is expressed by the following Expression (3).

$$\Delta r(\theta,\varphi)=r(\theta,\varphi)-E[r](\varphi) \quad (3)$$

In FIG. 18, the value Δr(θ, φ) is expressed by a gray scale. The more the edge position projects outside, the lighter color (the closer to white) it is displayed with. Further, the deeper the edge position is recessed, the darker color (the closer to black) it is displayed with. For example, it is understood that the edge position projects in a range of θ=45° to 60° and φ=−80° to −30°. Note that although the value Δr(θ, φ) is expressed by a gray scale in FIG. 18, it can be expressed by a color image.

As described above, the processing unit 50 displays, as the feature value according to the edge position, the unevenness data Δr(θ, φ) in the monitor. The processing unit 50 displays the unevenness data Δr(θ, φ) in the form of a two-dimensional map. The processing unit 50 displays a graph in which a horizontal axis indicates θ-angles and the unevenness data Δr(θ, φ) is expressed by shading or a color image on the monitor. The vertical axis is not limited to the angle φ and may indicate values indicating the Z-position. As described above, by displaying the θ-dependence of feature values according to the edge position in the form of a graph, a user can easily recognize variations of edge shapes and a distribution thereof. Therefore, the user can appropriately evaluate and manage quality of the edge part 31.

In the measurement method according to the present embodiment, it is possible to acquire a sufficient number of detection data in a short time. Therefore, it is possible to two-dimensionally extend the unevenness data Δr(θ, φ) indicating unevenness, obtained from the average value of the edge value, and thereby converting it into a graph. By measuring the edge position over the entire circumference as measurement data the edge position, it is possible to evaluate and manage the edge position from various points of view.

The processing unit 50 displays the graphs shown in FIGS. 13 to 18 in the monitor. In this way, a user can easily recognize variations of the edge shape.

Some or all of the above-described processes may be performed by a computer program. The above-described program can be stored in various types of non-transitory computer readable media and thereby supplied to the computer. The non-transitory computer readable media includes various types of tangible storage media. Examples of the non-transitory computer readable media include a magnetic recording medium (such as a flexible disk, a magnetic tape, and a hard disk drive), a magneto-optic recording medium (such as a magneto-optic disk), a CD-ROM (Read Only Memory), a CD-R, and a CD-R/W, and a semiconductor memory (such as a mask ROM, a PROM (Programmable ROM), an EPROM (Erasable PROM), a flash ROM, and a RAM (Random Access Memory)). Further, the program can be supplied to the computer by using various types of transitory computer readable media. Examples of the transitory computer readable media include an electrical signal, an optical signal, and an electromagnetic wave. The transitory computer readable media can be used to supply programs to the computer through a wire communication path such as an electrical wire and an optical fiber, or wireless communication path.

Although the embodiments according to the present disclosure have been explained above, the present disclosure also includes various modifications that do not substantially impair the purposes and the advantages of the present disclosure. Further, the above-described embodiments should not be used to limit the scope of the present disclosure.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

The invention claimed is:

1. A measurement apparatus comprising:
an objective lens positioned so that its focal plane cuts across an edge part of a substrate, and configured to concentrate illumination light so that a linear illumination area is formed on the focal plane;
a detector comprising a plurality of pixels arranged along a direction of the linear illumination area, and configured to detect a reflected light from the edge part of the substrate through a confocal optical system;
an optical head in which the objective lens and the detector are disposed;
a moving mechanism configured to change a relative position of the optical head with respect to the substrate so that an inclination of the focal plane with respect to the substrate is changed; and
a processing unit configured to measure a shape of the edge part based on a position of the detector at which intensity of the reflected light reaches a peak.

2. The measurement apparatus according to claim 1, further comprising a rotatable stage configured to rotate the substrate, wherein
the reflected light is detected while rotating the rotatable stage.

3. The measurement apparatus according to claim 1, wherein:
the moving mechanism rotationally moves the optical head around a rotational axis; and
the rotational axis is perpendicular to a plane including a Z-axis parallel to a thickness direction of the substrate and an optical axis of the objective lens, and passes through the inside of the substrate.

4. The measurement apparatus according to claim 1, wherein the processing unit converts the position at which the intensity of the reflected light reaches the peak in the detector into an edge position on a plane including a Z-axis along a thickness direction of the substrate and an optical axis of the objective lens.

5. The measurement apparatus according to claim 4, wherein the processing unit obtains two edge positions disposed on both sides of the optical axis of the objective lens.

6. The measurement apparatus according to claim 1, wherein a graph showing angle dependence of a feature value representing an edge shape is displayed.

7. A measurement method using a measurement apparatus,
the measurement apparatus comprising:
an objective lens positioned so that its focal plane cuts across an edge part of a substrate, and configured to concentrate illumination light so that a linear illumination area is formed on the focal plane;
a detector comprising a plurality of pixels arranged along a direction of the linear illumination area, and configured to detect a reflected light from the edge part of the substrate through a confocal optical system; and
an optical head in which the objective lens and the detector are disposed,
the measurement method comprising:
changing a relative position of the optical head with respect to the substrate so that an inclination of the focal plane with respect to the substrate is changed; and
measuring a shape of the edge part based on a position of the detector at which intensity of the reflected light reaches a peak.

8. The measurement method according to claim 7, wherein the reflected light is detected while rotating the substrate.

9. The measurement method according to claim 7, wherein:
in the changing the relative position of the optical head, the optical head is rotationally moved around a rotational axis; and
the rotational axis is perpendicular to a plane including a Z-axis parallel to a thickness direction of the substrate and an optical axis of the objective lens, and passes through the inside of the substrate.

10. The measurement method according to claim 7, wherein in the measuring the shape of the edge part, the position at which the intensity of the reflected light reaches the peak in the detector is converted into an edge position on a plane including a Z-axis along a thickness direction of the substrate and an optical axis of the objective lens.

11. The measurement method according to claim 10, wherein in the measuring the shape of the edge part, two edge positions disposed on both sides of an optical axis of the objective lens are obtained.

12. The measurement method according to claim 7, wherein a graph showing angle dependence of a feature value representing an edge shape is displayed.

* * * * *